United States Patent
Ashida et al.

(10) Patent No.: US 11,211,547 B2
(45) Date of Patent: Dec. 28, 2021

(54) SPIN-ORBIT-TORQUE TYPE MAGNETIZATION ROTATING ELEMENT, SPIN-ORBIT-TORQUE TYPE MAGNETORESISTANCE EFFECT ELEMENT, AND MAGNETIC MEMORY

(71) Applicant: TDK CORPORATION, Tokyo (JP)

(72) Inventors: Takuya Ashida, Tokyo (JP); Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/493,419

(22) PCT Filed: Feb. 6, 2019

(86) PCT No.: PCT/JP2019/004188
§ 371 (c)(1),
(2) Date: Sep. 12, 2019

(87) PCT Pub. No.: WO2019/167575
PCT Pub. Date: Sep. 6, 2019

(65) Prior Publication Data
US 2020/0136017 A1    Apr. 30, 2020

(30) Foreign Application Priority Data

Feb. 28, 2018  (JP) .............................. JP2018-035220

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *H01F 10/329* (2013.01); *H01F 41/32* (2013.01);
(Continued)

(58) Field of Classification Search
CPC .......... H01L 27/222–228; H01L 43/02; H01F 10/329; G11C 11/161
See application file for complete search history.

(56) References Cited

U.S. PATENT DOCUMENTS

| | | |
|---|---|---|
| 8,350,347 B2 | 1/2013 | Gaudin et al. |
| 2011/0303146 A1* | 12/2011 | Nishijima ......... H01J 37/32412 118/708 |

(Continued)

FOREIGN PATENT DOCUMENTS

| | | |
|---|---|---|
| JP | 2017-059594 A | 3/2017 |
| JP | 2017-216286 A | 12/2017 |
| WO | 2016/021468 A1 | 2/2016 |

OTHER PUBLICATIONS

Kato, Y. K. et al., "Observation of the Spin Hall Effect in Semiconductors", Science, vol. 306, pp. 1910-1913, (2004).

(Continued)

*Primary Examiner* — Vincent Wall
(74) *Attorney, Agent, or Firm* — Oliff PLC

(57) ABSTRACT

A spin-orbit-torque type magnetization rotating element includes: a spin-orbit torque wiring extending in a first direction; and a first ferromagnetic layer laminated on the spin-orbit torque wiring, wherein the spin-orbit torque wiring includes a metal oxide whose electrical conductivity properties exhibit a metallic behavior with respect to temperature, and an oxygen concentration in a region on the first ferromagnetic layer side and an oxygen concentration in a region opposite to the first ferromagnetic layer are asymmetrical with respect to a center of the spin-orbit torque wiring in a thickness direction thereof.

8 Claims, 5 Drawing Sheets

(51) Int. Cl.
  *H01F 10/32* (2006.01)
  *H01F 41/32* (2006.01)
  *H01L 27/22* (2006.01)
  *H01L 43/10* (2006.01)
  *H01L 43/12* (2006.01)

(52) U.S. Cl.
  CPC ............ *H01L 27/222* (2013.01); *H01L 43/10* (2013.01); *H01L 43/12* (2013.01); *H01F 10/3254* (2013.01); *H01F 10/3286* (2013.01)

(56) References Cited

U.S. PATENT DOCUMENTS

| | | |
|---|---|---|
| 2015/0348606 A1 | 12/2015 | Buhrman et al. |
| 2017/0076769 A1* | 3/2017 | Shirotori .................. H01L 43/02 |
| 2017/0222135 A1 | 8/2017 | Fukami et al. |

OTHER PUBLICATIONS

Miron, I. M. et al., "Perpendicular Switching of a Single Ferromagnetic Layer Induced By In-Plane Current Injection", Nature, vol. 476, pp. 189-194, (2011).

Liu, L. et al., "Spin Torque Switching With the Giant Spin Hall Effect of Tantalum", Science, vol. 336, 555, 32 pages, (2012).

Liu, L. et al., "Current-Induced Switching of Perpendicularly Magnetized Magnetic Layers Using Spin Torque From the Spin Hall Effect", Physical Review Letters, vol. 109, pp. 096602-1-096602-5, (2012).

Lee, KS. et al., "Threshold Current for Switching of a Perpendicular Magnetic Layer Induced By Spin Hall Effect", Applied Physics Letters, vol. 102, 112410, 18 pages, (2013).

Lee, KS. et al., "Thermally Activated Switching of Perpendicular Magnet By Spin-Orbit Spin Torque", Applied Physics Letters, vol. 104, pp. 072413-1-072413-5, (2014).

Fukami, S. et al., "Magnetization Switching By Spin-Orbit Torque in an Antiferromagnet-Ferromagnet Bilayer System", Nature Materials, vol. 15, pp. 535-542, (2016).

Fukami, S. et al., "A Spin-Orbit Torque Switching Scheme With Collinear Magnetic Easy Axis and Current Configuration", Nature Nanotechnology, vol. 11, 621, 6 pages, (2016).

Takahashi, S. et al., "Spin Injection and Detection in Magnetic Nanostructures", Physical Review B, vol. 67, pp. 052409-1-052409-4, (2003).

Seo, Y. et al., "Area-Efficient SOT-MRAM With a Schottky Diode", IEEE Electron Device Letters, vol. 37, No. 8, pp. 982-985, (2016).

* cited by examiner

SPIN-ORBIT-TORQUE TYPE MAGNETIZATION ROTATING ELEMENT, SPIN-ORBIT-TORQUE TYPE MAGNETORESISTANCE EFFECT ELEMENT, AND MAGNETIC MEMORY

TECHNICAL FIELD

The present invention relates to a spin-orbit-torque type magnetization rotating element, a spin-orbit-torque type magnetoresistance effect element, and a magnetic memory.

Priority is claimed on Japanese Patent Application No. 2018-035220, filed Feb. 28, 2018, the content of which is incorporated herein by reference.

BACKGROUND ART

Giant magnetoresistance (GMR) elements formed of a multilayer film constituted of a ferromagnetic layer and a non-magnetic layer and tunneling magnetoresistance (TMR) elements having an insulating layer (a tunnel barrier layer or a barrier layer) as a non-magnetic layer are known as magnetoresistance effect elements. Generally, TMR elements have a higher element resistance and a higher magnetoresistive (MR) ratio than GMR elements. For this reason, TMR elements are attracting attention as magnetic sensors, high frequency components, magnetic heads, and elements for nonvolatile random access memories (MRAMs).

An MRAM reads and writes data by an element resistance of a TMR element which changes when directions of the magnetization of two ferromagnetic layers sandwiching an insulating layer change. As a writing method of an MRAM, a method in which writing, namely magnetization reversal is performed using a magnetic field generated by a current or a method in which writing, namely magnetization reversal is performed using spin transfer torque (STT) generated by flowing current in a lamination direction of a magnetoresistance effect element are known.

Although the magnetization reversal of a TMR element by STT is efficient in view of energy efficiency, it is necessary to flow current in a lamination direction of a magnetoresistance effect element when writing data. A magnetoresistance effect element may be degraded by write current.

Thus, in recent years, attention has been paid to a magnetization reversal element which reverse magnetization by pure spin current generated by spin-orbit interaction, which is mechanism different from STT (for example, Patent Document 1). SOT is induced by a pure spin current caused by spin-orbit interaction or a Rashba effect at an interface between dissimilar materials. This magnetoresistance effect element flows current for inducing SOT in the magnetoresistance effect element in a direction intersecting a lamination direction of the magnetoresistance effect element. That is to say, it is not necessary to flow current in the lamination direction of the magnetoresistance effect element and it is expected that such a magnetoresistance effect element would have a long lifespan.

CITATION LIST

Patent Literature

[Patent Document 1]
Japanese Unexamined Patent Application, First Publication No. 2017-216286

SUMMARY OF INVENTION

Technical Problem

It can be said that a reversal current density used for reversing the magnetization of a ferromagnetic layer due to SOT is substantially the same as a reversal current density used for revering the magnetization of a ferromagnetic layer due to STT. A flow of a current which generates a spin current is less likely to damage the magnetoresistance effect element. On the other hands, elements utilizing SOT are required to have a reduced reversal current density in view of driving efficiency. In order to reduce the reversal current density of elements utilizing SOT, there is a need for an element constitution which can generate spin current more efficiently.

Patent Document 1 describes that the generation efficiency of spin current is enhanced by forming oxide films such as CuO or $Cu_2O$ above one surface of a paramagnetic layer made of Cu. However, these oxide films have insulating properties and almost no current which generates spin current flows. For this reason, only the generation efficiency of spin current is improved by the effect of an interface and it cannot be said that spin current can be generated sufficiently efficiently.

The present disclosure was made in view of the above-described circumstances and an objective of the present disclosure is to provide a spin-orbit-torque type magnetization rotating element, a spin-orbit-torque type magnetoresistance effect element, and a magnetic memory capable of efficiently generating a spin current.

Solution to Problem

In order to accomplish the above-described objective, the present disclosure provides the following means.

(1) A spin-orbit-torque type magnetization rotating element according to a first aspect includes: a spin-orbit torque wiring extending in a first direction; and a first ferromagnetic layer laminated on the spin-orbit torque wiring, wherein the spin-orbit torque wiring includes a metal oxide whose electrical conductivity properties exhibit a metallic behavior with respect to temperature, and an oxygen concentration in a region on the first ferromagnetic layer side and an oxygen concentration in a region opposite to the first ferromagnetic layer are asymmetrical with respect to a center of the spin-orbit torque wiring in a thickness direction thereof.

(2) In the spin-orbit-torque type magnetization rotating element according to the aspect, the spin-orbit torque wiring may include a portion where an oxygen concentration monotonously increase or monotonically decrease in the thickness direction of the spin-orbit torque wiring.

(3) In the spin-orbit-torque type magnetization rotating element according to the aspect, the spin-orbit torque wiring may contain an oxide of one or more elements selected from the group consisting of Cr, Fe, Ir, W, Mo, Re, Ti, V, Nb, Pd, Ru, and Sn.

(4) In the spin-orbit-torque type magnetization rotating element according to the aspect, the spin-orbit torque wiring may contain an oxide of one or more elements selected from the group consisting of Ti, W, Pd, Mo, Nb, and Re.

(5) In the spin-orbit-torque type magnetization rotating element according to the aspect, the spin-orbit torque wiring may have a metal insertion layer at any position in the thickness direction thereof.

(6) In the spin-orbit-torque type magnetization rotating element according to the aspect, the spin-orbit torque wiring may have the metal insertion layer at a position farther from the first ferromagnetic layer than the center of the spin-orbit torque wiring in the thickness direction thereof.

(7) In the spin-orbit-torque type magnetization rotating element according to the aspect, a metal element constituting the metal insertion layer may be different from a metal element constituting the metal oxide of the spin-orbit torque wiring.

(8) In the spin-orbit-torque type magnetization rotating element according to the aspect, a thickness of the metal insertion layer may be less than twice ion radii of metal atoms constituting the metal insertion layer.

(8) In the spin-orbit-torque type magnetization rotating element according to the aspect, in the view of the thickness direction, an oxygen concentration at a first point overlapping the first ferromagnetic layer of the spin-orbit torque wiring may be lower than an oxygen concentration at a second point not overlapping the first ferromagnetic layer.

(6) A spin-orbit-torque type magnetoresistance effect element according to a second aspect includes: the spin-orbit-torque type magnetization rotating element according to the aspect; a second ferromagnetic layer disposed above the first ferromagnetic layer; and a non-magnetic layer located between the first ferromagnetic layer and the second ferromagnetic layer.

(7) A magnetic memory according to a third aspect includes: a plurality of the spin-orbit-torque type magnetoresistance effect elements according to the aspect.

Advantageous Effects of Invention

A spin-orbit-torque type magnetization rotating element, a spin-orbit-torque type magnetoresistance effect element, a magnetic memory, and a high frequency magnetic element capable of efficiently generating a pure spin current can be provided.

DESCRIPTION OF EMBODIMENTS

Figure 1:
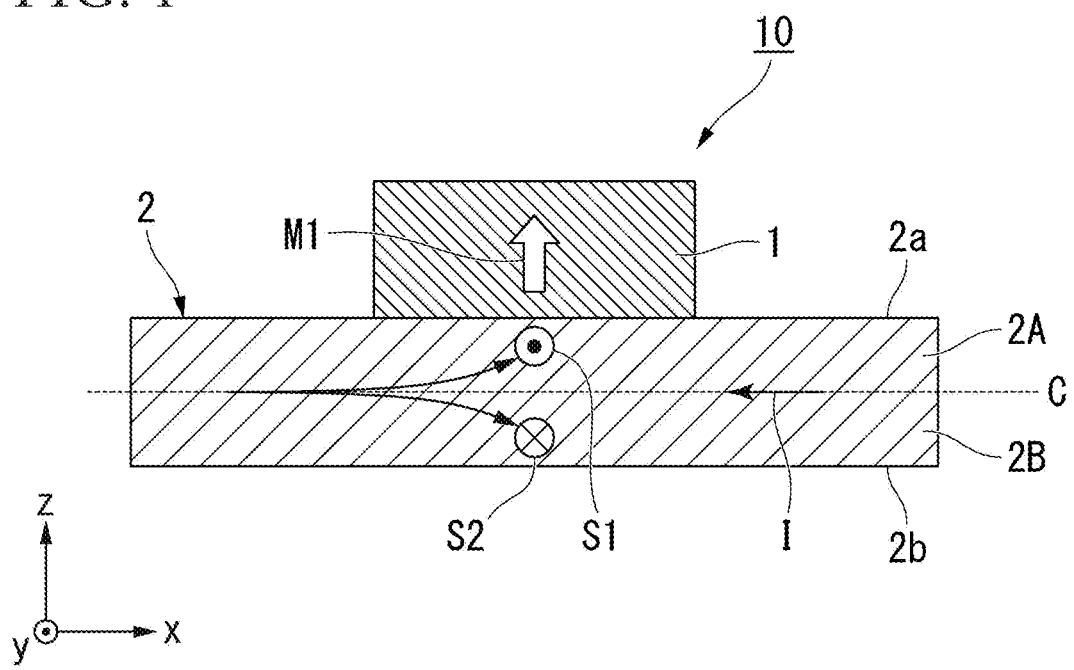
FIG. 1 is a schematic cross-sectional view of a spin-orbit-torque type magnetization rotating element according to a first embodiment.

An embodiment will be described in detail below with reference to the drawings as appropriate. In the drawings used in the following description, in order to facilitate understanding of the features of the embodiment, for the sake of convenience, enlarged characteristic portions are shown in some cases and dimensional ratios between the constituent elements and the like may be different from the actual dimensional ratios in some cases. The materials, dimensions, and the like in the following description are mere exemplary examples and the embodiment is not limited thereto and the embodiment can be implemented through appropriate modifications without departing from the gist of the present invention.

First Embodiment

FIG. 1 is a cross-sectional view schematically showing a spin-orbit-torque type magnetization rotating element according to a first embodiment. A spin-orbit-torque type magnetization rotating element 10 according to the first embodiment includes a first ferromagnetic layer 1 and a spin-orbit torque wiring 2.

Description will be provided below in a state in which a first direction in which the spin-orbit torque wiring 2 extends is defined as an x direction, a direction orthogonal to the first direction in a plane in which the spin-orbit torque wiring 2 is present is defined as a y direction, and a direction orthogonal to both the x direction and the y direction is defined as a z direction. In FIG. 1, the z direction coincides with a lamination direction in which the first ferromagnetic layer 1 is laminated and a thickness direction of the spin-orbit torque wiring 2.

<First Ferromagnetic Layer>

The first ferromagnetic layer 1 has a magnetization M1. When the direction of the magnetization M1 changes, the spin-orbit-torque type magnetization rotating element 10 shows an anisotropic magnetoresistive effect. In the case of a spin-orbit-torque type magnetoresistance effect element which will be described later, when the direction of the magnetization M1 changes, a magnetoresistive effect is showed. Although the first ferromagnetic layer 1 is a perpendicular magnetized film in which the magnetization M1 is oriented in the z direction in FIG. 1, the first ferromagnetic layer 1 may be an in-plane magnetized film in which the magnetization M1 is oriented in any direction in an xy in-plane direction. Furthermore, the magnetization M1 may be inclined with respect to any or all of the x direction, the y direction, and the z direction.

A ferromagnetic material, particularly, a soft magnetic material can be applied to the first ferromagnetic layer 1. For example, a metal selected from the group consisting of Cr, Mn, Co, Fe, and Ni, an alloy containing at least one of these metals, an alloy containing at least one of these metals and at least one element from B, C, and N, and the like can be used. To be specific, Co—Fe, Co—Fe—B, and Ni—Fe are exemplary examples.

Also, a Heusler alloy may be used for the first ferromagnetic layer 1. A Heusler alloy has high spin polarization and a wide range of magnetoresistance change. A Heusler alloy contains an intermetallic compound having a chemical composition represented by XYZ or $X_2YZ$. Here, X is a transition metal element or a noble metal element from the Co, Fe, Ni, or Cu groups in the periodic table, Y is a transition metal from the Mn, V, Cr, or Ti groups or an element of the X type, and Z is a typical element from Group III to Group V. Examples of a Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

<Spin-Orbit Torque Wiring>

The spin-orbit torque wiring 2 extends in the x direction. The spin-orbit torque wiring 2 is connected to one surface of the first ferromagnetic layer 1 in the z direction. The spin-orbit torque wiring 2 may be directly connected to the first ferromagnetic layer 1 or may be connected via another layer.

The spin-orbit torque wiring 2 generates spin current due to spin Hall effect when current flows therethrough. Spin Hall effect is a phenomenon in which spin current is induced in a direction orthogonal to current flow direction due to spin-orbit interaction when current flows through a wiring. A mechanism by which spin current is generated due to the spin Hall effect will be described.

As shown in FIG. 1, when potential difference is applied to both ends of the spin-orbit torque wiring 2 in the x direction, current I flows in the x direction. When the current I flows, a first spin S1 oriented in the y direction and a second spin S2 oriented in the −y direction respectively bent from the direction in which the current flows to a orthogonal direction. Although normal Hall effect and the spin Hall effect are the same in that a moving (traveling) direction of moving (traveling) electric charges (electrons) is bent, the normal Hall effect and the spin Hall effect significantly differ in that charged particles moving in magnetic field are subjected to a Lorentz force due to the normal Hall effect and thus the moving direction thereof is bent, and the traveling direction thereof is bent only by the movement of electrons (only the flowing of a current) due to the spin Hall effect even though there is no magnetic field.

In the case of a non-magnetic material, namely a material which is not a ferromagnetic material, the number of electrons of the first spin S1 is equal to the number of electrons of the second spin S2. Thus, in the drawings, the number of electrons of the first spin S1 going upward is equal to the number of electrons of the second spin S2 going downward. The movements of spins in the spin-orbit torque wiring 2 cancel each other out as a net flow of electric charges and the generated current is zero. Spin current in which no current flows is particularly referred to as pure spin current.

Here, when flow of electrons of the first spin S1 is represented by $J_\uparrow$, flow of electrons of the second spin S2 is represented by $J_\downarrow$, and pure spin current is represented by $J_S$, they are defined by $J_S = J_\uparrow - J_\downarrow$. In FIG. 1, $J_S$ as the pure spin current flows in the z direction in the drawing. Here, $J_S$ is flow of electrons with a polarization of 100%.

In FIG. 1, when a ferromagnetic material is brought into contact with an upper surface of the spin-orbit torque wiring 2, pure spin current diffuses and flows into the ferromagnetic material. That is to say, spins are injected into the first ferromagnetic layer 1.

The spin-orbit torque wiring 2 includes a metal oxide whose electrically conductive properties exhibit a metallic behavior with respect to temperature. Here, the expression "electrically conductive properties exhibit a metallic behavior with respect to temperature" means that the higher the temperature is, the higher the electrical resistivity tends to be. The metal oxide is made of a material which exhibits a resistivity of $10^3$ Ω·m or less at room temperature as a specific resistance unique to the material. Examples of the metal oxide include oxides of Ir ($IrO_2$), oxides of W ($WO_3$), oxides of Pd ($PdO_2$), oxides of Mo ($Mo_4O_{11}$), oxides of Nb (NbO), oxides of Re ($ReO_3$), oxides of Fe (FeO and $Fe_3O_4$), oxides of Cr ($CrO_2$), oxides of V ($VO_2$ and $V_2O_3$), oxides of Ti (TiO and $Ti_2O_3$), oxides of Ru ($RuO_2$ and $RuO_3$), oxides of Sn ($SnO_2$), oxides of In ($In_2O_3$), and the like. The spin-orbit torque wiring 2 is conductive and the current I flows in the spin-orbit torque wiring 2.

An oxygen concentration of a first region 2A on the first ferromagnetic layer 1 side and an oxygen concentration of a second region 2B on a side opposite to the first ferromagnetic layer 1 are asymmetrical with respect to a reference line C located at a center of the spin-orbit torque wiring 2 in the thickness direction thereof, namely the z direction. That is to say, the spin-orbit torque wiring 2 has a distribution of an oxygen concentration in the thickness direction of the spin-orbit torque wiring 2 with respect to an oxygen concentration in a stoichiometric composition ratio of the metal oxide. The concentration of oxygen need not to be constant in the first region 2A and the second region 2B and the oxygen concentration may also fluctuate in these regions.

If the oxygen concentration is asymmetrical with respect to the reference line C in the thickness direction of the spin-orbit torque wiring 2, the symmetry in the spin-orbit torque wiring 2 is broken. This breaking of symmetry generates an internal field in the spin-orbit torque wiring 2. This internal field promotes the separation of the first spin S1 and the second spin S2 due to the spin Hall effect and generates a spin current with high efficiency.

It is desirable that the oxygen concentration have a monotonously increasing or monotonically decreasing portion in the thickness direction of the spin-orbit torque wiring 2. A difference in oxygen concentration generates a difference in space inversion symmetry of crystal constituting the spin-orbit torque wiring 2. That is to say, the difference in oxygen concentration changes a crystal structure of the spin-orbit torque wiring 2. When the oxygen concentration monotonously decreases or monotonously increases, the crystal structure of the spin-orbit torque wiring 2 is prevented from being rapidly changed. As a result, a direction of a vector of a force applied to the first spin S1 and the second spin S2 by the internal field generated due to the breaking of the symmetry can be aligned at each point.

It is more desirable that the oxygen concentration monotonously increases or monotonously decreases from the vicinity of a first surface 2a on the first ferromagnetic layer 1 side of the spin-orbit torque wiring 2 toward the vicinity of a second surface 2b on the opposite side. Here, regarding the meaning of the vicinity of the first surface 2a and the vicinity of the second surface 2b, an interface with other layers may be affected by diffusion and the like of an element and be subjected to locally rapid changing of an oxygen concentration in some cases and this portion is excluded. To be specific, this means excluding a thickness of 0.3 nm from the interface.

The metal oxide constituting the spin-orbit torque wiring 2 may be one or more elements selected from the group consisting of Ir, W, Pd, Mo, Nb, Re, Fe, Cr, V, Ti, Ru, and Sn. These elements can be selected to coexist in different states in accordance with the oxygen concentration. For this reason, it is easy to generate the breaking of the space inversion symmetry of the crystal in the thickness direction and the spin current can be generated efficiently.

Also, the spin-orbit torque wiring 2 may be an oxide of one or more elements selected from the group consisting of Ir, W, Pd, Mo, Nb, and Re. These metals are heavy elements having a large atomic number and efficiently generate spin current. Spin current can be generated more efficiently due to the effect of scattering due to heavy elements and the effect of changing the oxygen concentration to generate the breaking of the space inversion symmetry of the crystal.

Also, the spin-orbit torque wiring 2 may be an oxide of one or more elements selected from the group consisting of W, Fe, and V. These materials exhibit a metal-insulator transition. That is to say, these materials have insulating properties at low temperatures and are unlikely to generate spin current. For this reason, it is desirable to use these at a temperature higher than the metal-insulator transition temperature for having metallic electrical conductivity properties.

A concentration distribution of oxygen in the spin-orbit torque wiring 2 can be checked by examining a concentration distribution of oxygen of the metal oxide contained in the spin-orbit torque wiring 2. The concentration distribution can be examined, for example, using energy dispersive type X-ray spectroscopy (an EDX method). The EDX method includes irradiating a sample with an electron beam having a beam diameter of about 1 nm in diameter and separating the characteristic X-ray energies of the transmitted electrons. The composition of the sample is obtained from an energy spectrum after this separation.

The spin-orbit torque wiring 2 may contain other materials at the same time as long as it has the above-mentioned metal oxide as a main component.

For example, the spin-orbit torque wiring 2 may contain a magnetic metal. The magnetic metal refers to a ferromagnetic metal or an antiferromagnetic metal. When non-magnetic metals contain a small amount of magnetic metals, the non-magnetic metals serve as a cause of spin scattering. That is to say, the spin-orbit interaction is enhanced and the generation efficiency of the spin current with respect to the current flowing through the spin-orbit torque wiring 2 increases.

On the other hand, when an amount of magnetic metal to be added is excessively increased, the generated spin current scatters due to the added magnetic metal, and as a result, an action of decreasing the spin current may be strong in some cases. For this reason, it is desirable that a molar ratio of the added magnetic metal be sufficiently smaller than a total molar ratio of the elements constituting the spin-orbit torque wiring. Speaking as a guide, the molar ratio of the added magnetic metal is preferably 3% or less.

Also, for example, the spin-orbit torque wiring 2 may include a topological insulator. The spin-orbit torque wiring 2 may be mainly made of a topological insulator. The topological insulator is a material whose interior is an insulator or a high resistance substance and in which a spin-polarized metal state is generated on its surface. This material has an internal magnetic field called a spin-orbit interaction. Thus, even if there is no external magnetic field, a new topological phase develops due to a spin-orbit interaction effect. This is a topological insulator and with this is possible to generate a spin current with high efficiency using a strong spin-orbit interaction and breaking of inversion symmetry at an edge thereof.

Examples of topological insulator preferably include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. These topological insulators can generate a spin current with high efficiency.

Figure 2:
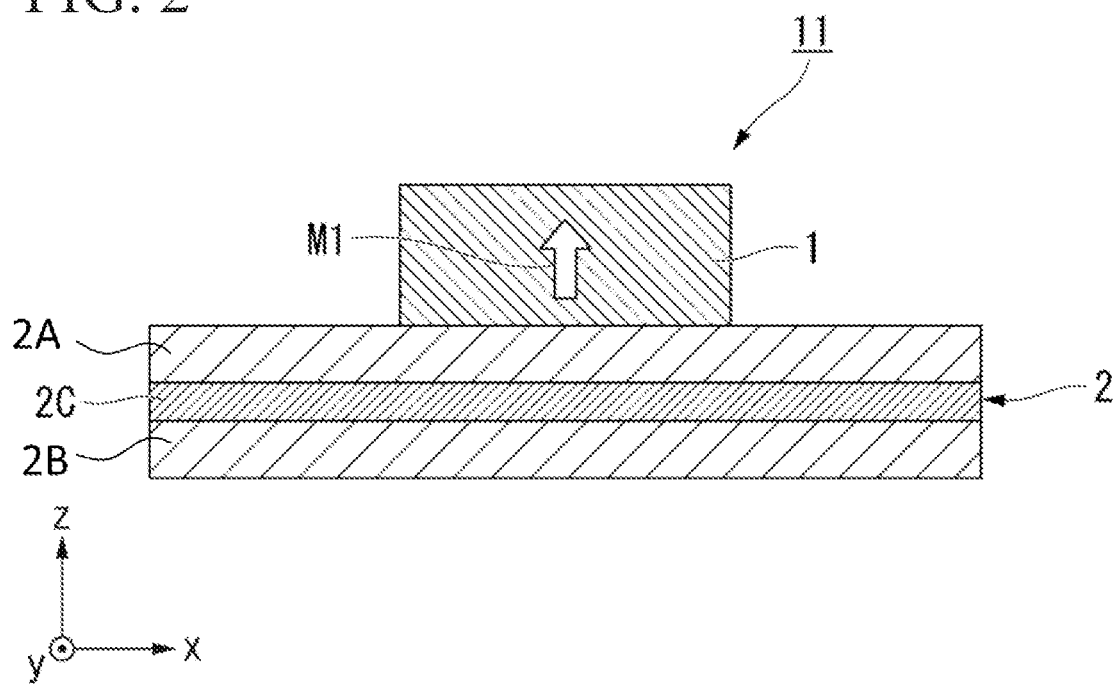
FIG. 2 is a schematic cross-sectional view of another example of the spin-orbit-torque type magnetization rotating element according to the first embodiment.

FIG. 2 is a schematic cross-sectional view of another example of the spin-orbit-torque type magnetization rotating element according to this embodiment. A metal insertion layer 2C may be disposed in a spin-orbit torque wiring 2 as in a spin-orbit-torque type magnetization rotating element 11 shown in FIG. 2. Although metal oxides have conductivity, metal oxides have conductivity inferior to those of metals. The metal insertion layer 2C can adjust the resistance value of the spin-orbit torque wiring 2 and can minimize an increase in power consumption and an increase in Joule heat of the spin-orbit-torque type magnetization rotating element 11.

Figure 3:
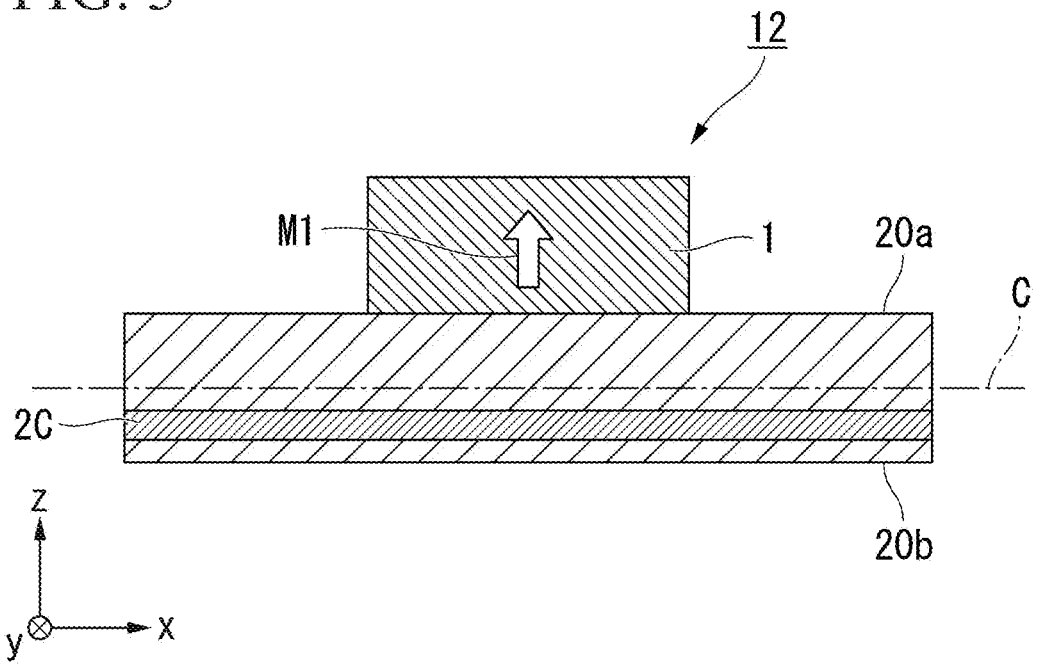
FIG. 3 is a schematic cross-sectional view of yet another example of the spin-orbit-torque type magnetization rotating element according to the first embodiment.

The metal insertion layer 2C may be disposed at any position in the thickness direction of the spin-orbit torque wiring 2. FIG. 3 is a schematic cross-sectional view of yet another example of the spin-orbit-torque type magnetization rotating element according to this embodiment. It is desirable that a spin-orbit-torque type magnetization rotating element 12 shown in FIG. 3 have a metal insertion layer 2C at a position farther from a first ferromagnetic layer 1 than a reference line C of a spin-orbit torque wiring 2. The metal insertion layer 2C may be a cause of scattering which inhibits the movement of spins in the z direction in some cases. Since the metal insertion layer 2C is at a position far from the first ferromagnetic layer 1, the movement of spins generated near the first ferromagnetic layer 1 can be smoothed and it is possible to enhance the efficiency of spin injection to the first ferromagnetic layer 1.

It is desirable to use an element different from a metal element constituting the metal oxide of the spin-orbit torque wiring 2 as a metal constituting the metal insertion layer 2C. By inserting metals which is different from a metal element constituting the metal oxide of the spin-orbit torque wiring, a difference in diffusion coefficient of oxygen makes it possible to increase a concentration gradient and generate spin current with high efficiency. The metal constituting the metal insertion layer 2C may be, for example, a metal selected from the group consisting of Au, Ag, Cu, Ni, Co, Fe, Ru, Al, W, Cr, and Ta or an alloy thereof.

It is desirable that a thickness of the metal insertion layer 2C be less than twice ion radii of metal atoms constituting the metal insertion layer 2. The thickness of the metal insertion layer 2C is an average thickness. The double of the ion radii of the metal atoms means a thickness corresponding to one layer of atoms and it is difficult to form a uniform film. For example, the metal insertion layer 2C may have a portion where two to three layers are stacked or a portion where an atom does not exist and is an opening, depending on the location. The average thickness is obtained, for example, as follows. Thicknesses of the metal insertion layer 2C are measured at ten different locations of the spin-orbit torque wiring 2 in the x direction. Sizes of measurement images at the locations are increased, for example, by $2 \times 10^6$ times. The thicknesses of the metal insertion layer 2C measured at ten locations are averaged.

The resistance value of the metal insertion layer 2C is lower than the resistance value of the spin-orbit torque wiring 2 as described above. By reducing the thickness of the metal insertion layer 2C, it is possible to prevent current from concentrating to the metal insertion layer 2C.

Figure 4:
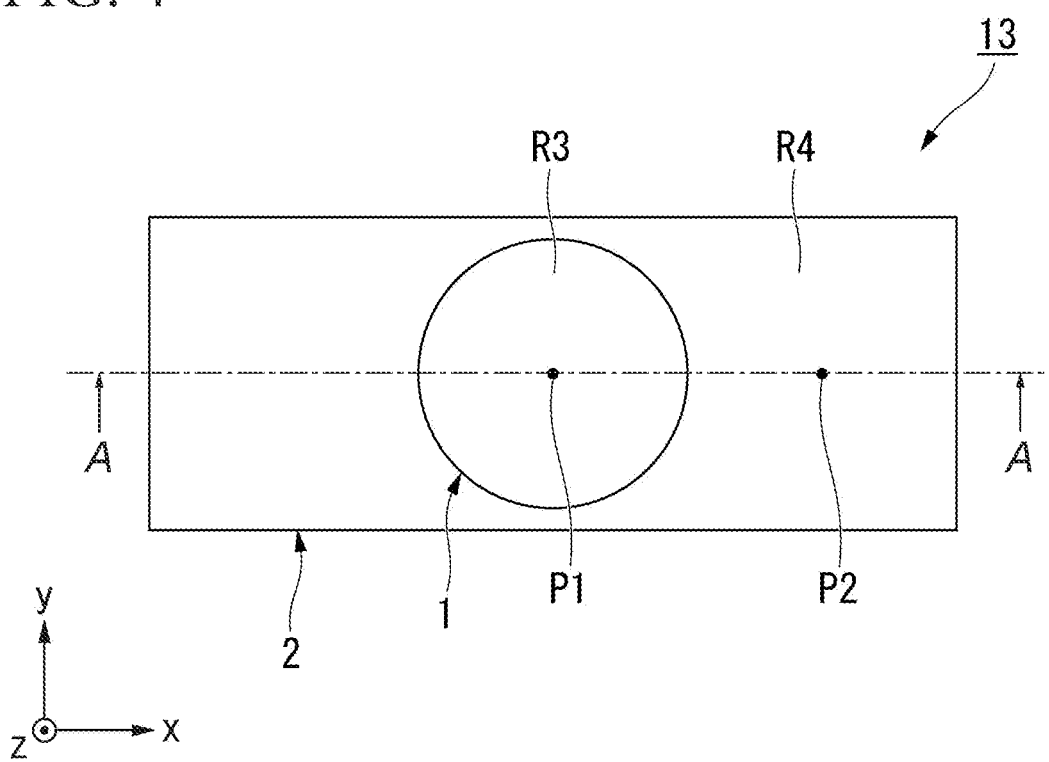
FIG. 4 is a schematic plan view of still another example of the spin-orbit-torque type magnetization rotating element according to the first embodiment.
Figure 7:
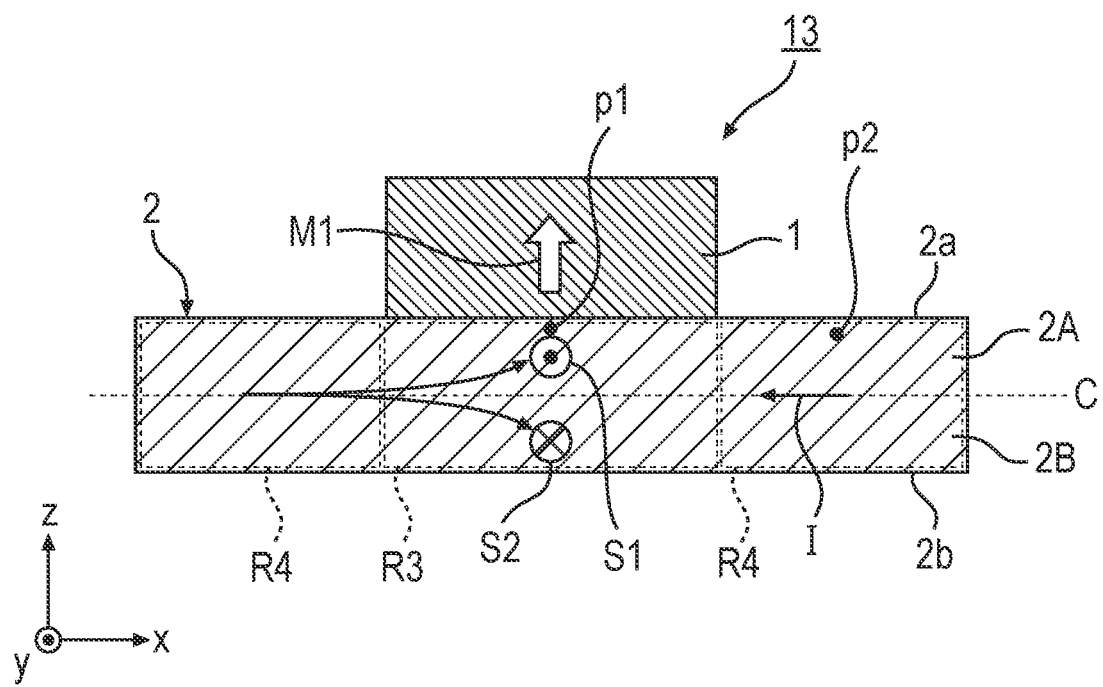
FIG. 7 is a schematic cross-sectional view of the example in FIG. 4 along reference line A.

Also, FIG. 4 is a schematic plan view of still another example of the spin-orbit-torque type magnetization rotating element according to this embodiment. A spin-orbit-torque type magnetization rotating element 13 shown in FIG. 4 includes a first ferromagnetic layer 1 and a spin-orbit torque wiring 2. The spin-orbit torque wiring 2 has a third region R3 which overlaps the first ferromagnetic layer 1 and a fourth region R4 which does not overlap the first ferromagnetic layer 1 in plan view from the z direction. An oxygen concentration at a first point P1 in the third region R3 is lower than an oxygen concentration at a second point P2 in the fourth region R4. The first point P1 and the second point P2 are at the same height position in the z direction, as seen in FIG. 7. The first point P1 is, for example, a center of the third region R3 in the x and y directions and a position deeper than the first surface 2a by 0.3 nm or more in the z direction. The second point P2 is, for example, a position at a distance of 10 nm or more away from a boundary between the third region R3 and the fourth region in a direction away from the third region and a position deeper than the first surface 2a by 0.3 nm or more in the z direction.

When the oxygen concentrations between the third region R3 and the fourth region R4 differ, there may be a distribution in an oxygen concentration in the xy in-plane direction. If there is the distribution in the concentration of oxygen in the xy in-plane direction, the symmetry of the spin-orbit torque wiring 2 is broken. The breaking of the symmetry generates an internal field in the spin-orbit torque wiring 2 and generates spin current with high efficiency.

The spin-orbit-torque type magnetization rotating element 10 may include constituent elements other than the first ferromagnetic layer 1 and the spin-orbit torque wiring 2. For example, a substrate or the like may be provided as a support body. The substrate preferably has an excellent flatness and examples of a material of the substrate include Si, AlTiC, and the like. Furthermore, an electrode, a via wiring, or the like used for flowing a current through the spin-orbit torque wiring 2 may be provided.

As described above, the spin-orbit-torque type magnetization rotating element 10 according to this embodiment can generate an internal field due to the breaking of the symmetry in the spin-orbit torque wiring 2 when the oxygen concentrations in the thickness direction thereof are asymmetrical with respect to the reference line C. This internal field promotes spin polarization and an amount of spins to be injected into the first ferromagnetic layer 1 increases. As a result, it is possible to reduce the reversal current density required to reverse the magnetization M1 of the first ferromagnetic layer 1.

<Manufacturing Method>

An example of a method of manufacturing the spin-orbit-torque type magnetization rotating element 10 will be described. First, a layer serving as the base of a spin-orbit torque wiring is laminated on a substrate (not shown). By changing a oxygen concentration in a chamber in a film formation process of this layer, it is possible to generate a difference in oxygen concentration in the thickness direction of the spin-orbit torque wiring 2. Examples of a lamination method include a known method such as a sputtering method and a chemical vapor deposition (CVD) method.

Subsequently, the layer serving as the base of the spin-orbit torque wiring is processed into the spin-orbit torque wiring 2 using a technique such as photolithography. Moreover, the spin-orbit torque wiring 2 is covered with an insulating layer to surround the periphery thereof. An oxide film, a nitride film, or the like can be used for the insulating layer.

Subsequently, surfaces of the insulating layer and the spin-orbit torque wiring are planarized using chemical mechanical polishing (CMP). Moreover, the layer serving as the base of the first ferromagnetic layer is laminated above the planarized surface. Finally, the spin-orbit-torque type magnetization rotating element 10 is obtained by processing the layer serving as the base of the first ferromagnetic layer using a technique such as photolithography.

Second Embodiment

<Spin-Orbit-Torque Type Magnetoresistance Effect Element>

Figure 5:
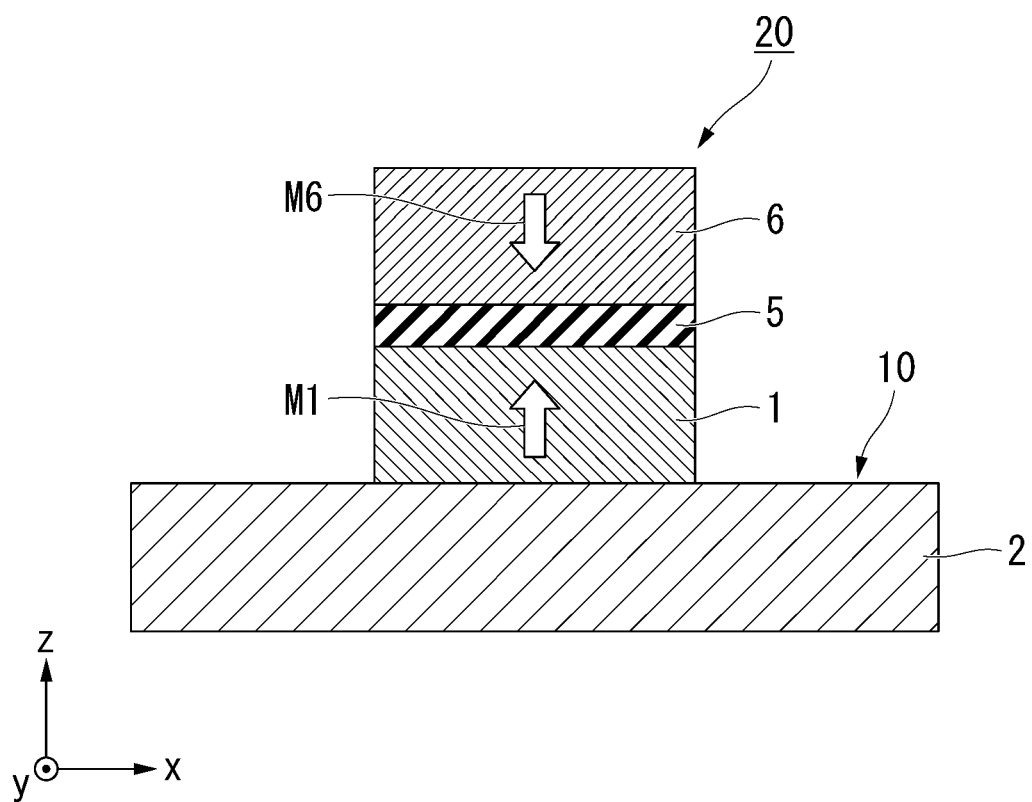
FIG. 5 is a schematic cross-sectional view of a spin-orbit-torque type magnetoresistance effect element according to a second embodiment.

FIG. 5 is a schematic cross-sectional view of a spin-orbit-torque type magnetoresistance effect element 20 according to a second embodiment. The spin-orbit-torque type magnetoresistance effect element 20 shown in FIG. 5 includes a spin-orbit-torque type magnetization rotating element 10, a non-magnetic layer 5, and a second ferromagnetic layer 6. Although the spin-orbit-torque type magnetization rotating element 10 is used as the spin-orbit-torque type magnetization rotating element in FIG. 3, another modified example may be used. A description of a constitution of the spin-orbit-torque type magnetoresistance effect element 20 that is the same as that of the spin-orbit-torque type magnetization rotating element 10 in the first embodiment will be omitted.

A laminate (a functional unit) obtained by laminating a first ferromagnetic layer 1, the non-magnetic layer 5, and the second ferromagnetic layer 6 functions in the same manner as in a normal magnetoresistance effect element. The functional unit functions when the magnetization M6 of the second ferromagnetic layer 6 is fixed in one direction (the z direction) and the orientation of the magnetization M1 of the first ferromagnetic layer 1 relatively changes. When the functional unit is applied to a coercivity difference type (a pseudo spin valve type) MRAM, the coercivity of the second ferromagnetic layer 6 is larger than the coercivity of the first ferromagnetic layer 1. When the functional unit is applied to an exchange bias type (spin value type) MRAM, the magnetization M6 of the second ferromagnetic layer 6 is fixed through the exchange coupling with an antiferromagnetic layer.

Also, in the functional unit, the functional unit has the same constitution as a tunneling magnetoresistance (TMR) element when the non-magnetic layer 5 is made of an insulator and has the same constitution as a giant magnetoresistance (GMR) element when the functional unit is made of a metal.

A known lamination constitution of the magnetoresistance effect element can be adopted as a lamination constitution of the functional unit. For example, each layer may be composed of a plurality of layers or may include another layer such as an antiferromagnetic layer which fixes a magnetization direction of the second ferromagnetic layer 6. The second ferromagnetic layer 6 is referred to as a fixed layer or a reference layer and the first ferromagnetic layer 1 is referred to as a free layer, a storage layer, or the like.

A known material can be used as a material of the second ferromagnetic layer 6. For example, a metal selected from the group consisting of Cr, Mn, Co, Fe, and Ni and an alloy which contains at least one of these metals and exhibits the ferromagnetism can be used. An alloy which contains at least one of these metals and at least one element selected from the group consisting of B, C, and N can also be used. To be specific, Co—Fe and Co—Fe—Bc are exemplary examples.

Also, a Heusler alloy may be used for the second ferromagnetic layer 6. A Heusler alloy has high spin polarization and a wide range of magnetoresistance change. A Heusler alloy contains an intermetallic compound having a chemical composition represented by XYZ or $X_2YZ$. Here, X is a transitional metal element or a noble metal element from the Co, Fe, Ni, or Cu groups in the periodic table, Y is a transition metal from the Mn, V, Cr, or Ti groups or an element of the X type, and Z is a typical element from Group III to Group V. Examples of a Heusler alloy include $Co_2FeSi$, $Co_2MnSi$, and $Co_2Mn_{1-a}Fe_aAl_bSi_{1-b}$.

In order to further increase the coercivity of the second ferromagnetic layer 6 with respect to the first ferromagnetic layer 1, an antiferromagnetic material such as IrMn and PtMn may be used as a material in contact with the second ferromagnetic layer 6. Furthermore, in order to prevent a leakage magnetic field of the second ferromagnetic layer 6 from affecting the first ferromagnetic layer 1, a synthetic ferromagnetic coupling structure may be adopted.

A known material can be used for the non-magnetic layer 5.

For example, when the non-magnetic layer 5 is made of an insulator (in the case of a tunnel barrier layer), $Al_2O_3$, $SiO_2$, MgO, $MgAl_2O_4$, or the like can be used as a material thereof. Furthermore, in addition to these materials, materials or the like in which a part of Al, Si, and Mg is substituted with Zn, Be, or the like can also be used. Among them, since MgO and $MgAl_2O_4$ are materials which can realize coherent tunneling, spins can be efficiently injected. When the non-magnetic layer 5 is made of a metal, Cu, Au, Ag, or the like can be used as a material thereof. Furthermore, when the non-magnetic layer 5 is made of a semiconductor, Si, Ge, $CuInSe_2$, $CuGaSe_2$, $Cu(In, Ga)Se_2$, or the like can be used as a material thereof.

The functional unit may include other layers. For example, an underlayer may be provided on a surface of the first ferromagnetic layer 1 opposite to the non-magnetic layer 5 and a cap layer may be provided on a surface of the second ferromagnetic layer 6 opposite to the non-magnetic layer 5.

It is desirable that a layer disposed between the spin-orbit torque wiring 2 and the first ferromagnetic layer 1 does not dissipate spins propagating from the spin-orbit torque wiring 2. For example, it is known that silver, copper, magnesium, aluminum, and the like have a long spin diffusion length of 100 nm or more and spins are difficult to dissipate.

Also, it is desirable that a thickness of this layer be a spin diffusion length or less of a material constituting the layer. When the thickness of the layer is the spin diffusion length or less, it is possible to sufficiently transmit the spins propagating from the spin-orbit torque wiring 2 to the first ferromagnetic layer 1.

The spin-orbit-torque type magnetoresistance effect element according to the second embodiment can record and read data using a change in resistance value of the functional unit caused due to a difference between relative angles of the magnetization M1 of the first ferromagnetic layer 1 and the magnetization M6 of the second ferromagnetic layer 6. Also in the spin-orbit-torque type magnetoresistance effect element 20 according to the second embodiment, spin current can be efficiently generated in the spin-orbit torque wiring 2. Thus, it is possible to reduce the reversal current density required for rotating (reversing) the magnetization M1 of the first ferromagnetic layer 1.

Third Embodiment

<Magnetic Memory>

Figure 6:
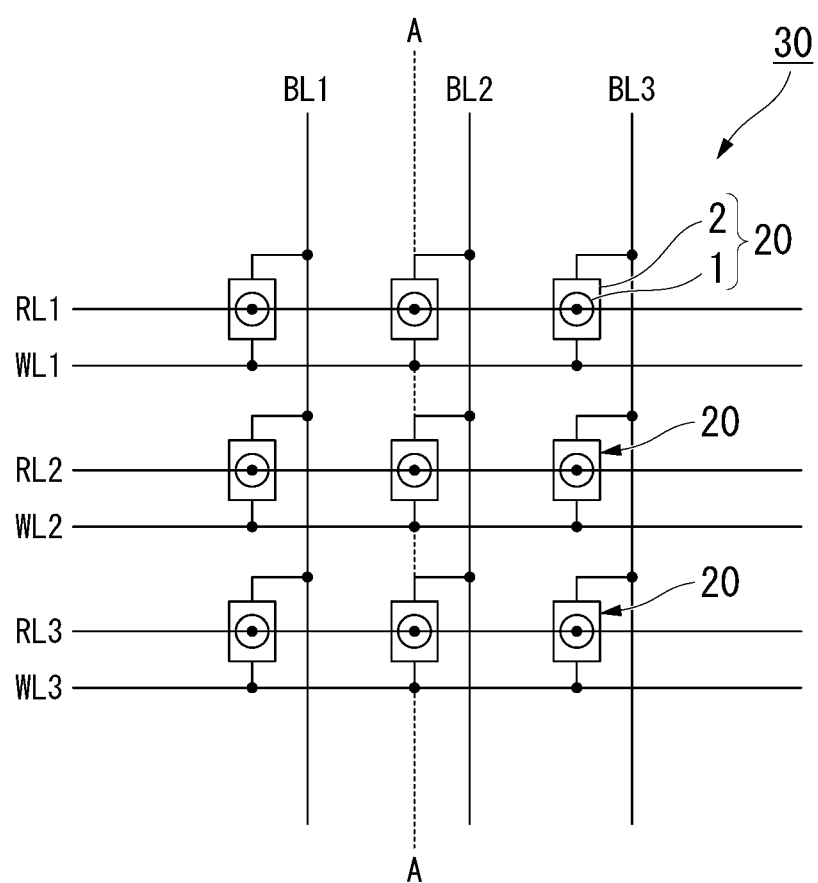
FIG. 6 is a diagram schematically showing a magnetic memory according to a third embodiment.

FIG. 6 is a plan view of a magnetic memory 30 which includes a plurality of the spin-orbit-torque type magnetoresistance effect elements 20 (refer to FIG. 5). FIG. 5 corresponds to a cross-sectional view of one of the spin-orbit-torque type magnetoresistance effect elements 20 cut along surface A-A in FIG. 6. In the magnetic memory 30 shown in FIG. 6, the spin-orbit-torque type magnetoresistance effect element 20 has a 3×3 matrix arrangement. FIG. 6 is an example of a magnetic memory and the number and disposition of the spin-orbit-torque type magnetoresistance effect element 20 are arbitrary.

One of word lines WL1 to WL3, one of bit lines BL1 to BL3, and one of read lines RL1 to RL3 are connected to the spin-orbit-torque type magnetoresistance effect element 20. By selecting one of the word lines WL1 to WL3 and one of the bit lines BL1 to BL3 to which a current is applied, the current flows to any spin-orbit torque wiring 2 in the spin-orbit-torque type magnetoresistance effect element 20, thereby performing a write operation. Furthermore, by selecting one of the read lines RL1 to RL3 and one of the bit lines BL1 to BL3 to which a current is applied, the current flows in any lamination direction of the spin-orbit-torque type magnetoresistance effect element 20, thereby performing a read operation. One of the word lines WL1 to WL3, one of the bit lines BL1 to BL3, and one of the read lines RL1 to RL3 to which a current is applied can be selected using a transistor or the like. That is to say, when data of an arbitrary element is read from the plurality of spin-orbit-torque type magnetoresistance effect elements 20, the magnetic memory 30 can be utilized as a magnetic memory.

While the preferred embodiments of the present invention have been described in detail above, the present invention is not limited to the specific embodiments, and various changes and modifications are possible without departing from the gist of the present invention disclosed in the claims.

REFERENCE SIGNS LIST

1 First ferromagnetic layer
2 Spin-orbit torque wiring
2A First region
2B Second region
2C Third region
2D Fourth region
2a First surface
2b Second surface
5 Non-magnetic layer
6 Second ferromagnetic layer
10, 11, 12, 13 Spin-orbit-torque type magnetization rotating element
20 Spin-orbit-torque type magnetoresistance effect element
30 Magnetic memory
M1, M6 Magnetization
C Reference line

What is claimed is:

1. A spin-orbit-torque type magnetization rotating element, comprising:
   a spin-orbit torque wiring extending in a first direction; and
   a first ferromagnetic layer laminated on the spin-orbit torque wiring,
   wherein the spin-orbit torque wiring consists of a metal oxide whose electrical conductivity properties exhibit a metallic behavior with respect to temperature,
   an oxygen concentration in a region of the spin-orbit torque wiring on a first ferromagnetic layer side and an oxygen concentration in a region of the spin-orbit torque wiring opposite to the first ferromagnetic layer are asymmetrical with respect to a center of the spin-orbit torque wiring in a thickness direction thereof, and
   the spin-orbit torque wiring includes a portion where an oxygen concentration monotonously increases or monotonically decreases in the thickness direction of the spin-orbit torque wiring.

2. The spin-orbit-torque type magnetization rotating element according to claim 1, wherein the metal oxide includes at least one element selected from the group consisting of Cr, Fe, Ir, W, Mo, Re, Ti, V, Nb, Pd, Ru, and Sn.

3. The spin-orbit-torque type magnetization rotating element according to claim 2, wherein the metal oxide includes at least one element selected from the group consisting of Ir, W, Pd, Mo, Nb, and Re.

4. The spin-orbit-torque type magnetization rotating element according to claim 1, wherein, in a view of the thickness direction, an oxygen concentration at a first point overlapping the first ferromagnetic layer of the spin-orbit torque wiring is lower than an oxygen concentration at a second point not overlapping the first ferromagnetic layer.

5. A spin-orbit-torque type magnetoresistance effect element, comprising:
   the spin-orbit-torque type magnetization rotating element according to claim 1;
   a second ferromagnetic layer facing the first ferromagnetic layer; and
   a non-magnetic layer located between the first ferromagnetic layer and the second ferromagnetic layer.

6. A magnetic memory, comprising:
   a plurality of the spin-orbit-torque type magnetoresistance effect elements according to claim 5.

7. A spin-orbit-torque type magnetization rotating element, comprising:
   a spin-orbit torque wiring extending in a first direction; and
   a first ferromagnetic layer laminated on the spin-orbit torque wiring,
   wherein the spin-orbit torque wiring consists of a metal oxide whose electrical conductivity properties exhibit a metallic behavior with respect to temperature,
   an oxygen concentration in a region of the spin-orbit torque wiring on a first ferromagnetic layer side and an oxygen concentration in a region of the spin-orbit torque wiring opposite to the first ferromagnetic layer are asymmetrical with respect to a center of the spin-orbit torque wiring in a thickness direction thereof, and
   in a view of the thickness direction, an oxygen concentration at a first point overlapping the first ferromagnetic layer of the spin-orbit torque wiring is lower than an oxygen concentration at a second point not overlapping the first ferromagnetic layer.

8. The spin-orbit-torque type magnetization rotating element according to claim 7, wherein the spin-orbit torque wiring includes a portion where an oxygen concentration monotonously increase or monotonically decrease in the thickness direction of the spin-orbit torque wiring.

* * * * *